United States Patent
Kaufmann et al.

(10) Patent No.: US 11,764,788 B2
(45) Date of Patent: Sep. 19, 2023

(54) ELECTRICAL EQUIPMENT AND METHOD FOR RECTIFYING DEVICE FAULTS

(71) Applicant: Siemens Aktiengesellschaft, Munich (DE)

(72) Inventors: Rainer Kaufmann, Berlin (DE); Dennis Persdorf, Berlin (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 17/738,258

(22) Filed: May 6, 2022

(65) Prior Publication Data

US 2022/0360264 A1  Nov. 10, 2022

(30) Foreign Application Priority Data

May 6, 2021 (EP) .................................... 21172364

(51) Int. Cl.
*H03K 19/1776* (2020.01)
*H02H 1/00* (2006.01)

(52) U.S. Cl.
CPC ....... *H03K 19/1776* (2013.01); *H02H 1/0092* (2013.01)

(58) Field of Classification Search
None
See application file for complete search history.

(56) References Cited

U.S. PATENT DOCUMENTS 7,764,081 B1   7/2010 Tuan et al.
2007/0198892 A1*  8/2007 Ng .................. G06F 11/1008
                                                    714/763

FOREIGN PATENT DOCUMENTS

JP      2017204664 A  * 11/2017
WO  WO 2004068668 A1    8/2004

OTHER PUBLICATIONS

"Single Event Upset"; Wikipedia, Mar. 3, 2017: 2017.
"LatticeXP2 Soft Error Detection (SED) Usage Guide", Lattice Semiconductor, Technical Note TN1130, Oct. 2021; 2012;.
"Static random-access memory" Wikipedia; 27.10.2020; 2020.
"Lattice XP2 sysCONFIG Usage Guide": Lattice Semiconductor, Technical Note TN 1141; Jan. 2014; 2014.
"Single Event Upsets in SEL Relays"; SEL Schweizer Engineering Laboratories; Derrick Haas und Karl Zimmermann; 2018; 2018.
"Field Programmable Gate Array"; Wikipedia, OCt. 14, 2020; 2020.

* cited by examiner

*Primary Examiner* — Anh Q Tran
(74) *Attorney, Agent, or Firm* — Laurence A. Greenberg; Werner H. Stemer; Ralph E. Locher

(57) ABSTRACT

An item of electrical equipment has a preprocessing device for digital measured values. The preprocessing device has an integrated circuit and an electronic memory chip that contains a configuration of a logic circuit. If a fault of the preprocessing device is identified, an operation of the preprocessing device is interrupted until the configuration of the logic circuit has been loaded from a configuration memory chip into the electronic memory chip. There is also described a method for rectifying device faults, such as by reloading a configuration of a logic circuit into an electronic memory chip of a preprocessing device.

11 Claims, 1 Drawing Sheet

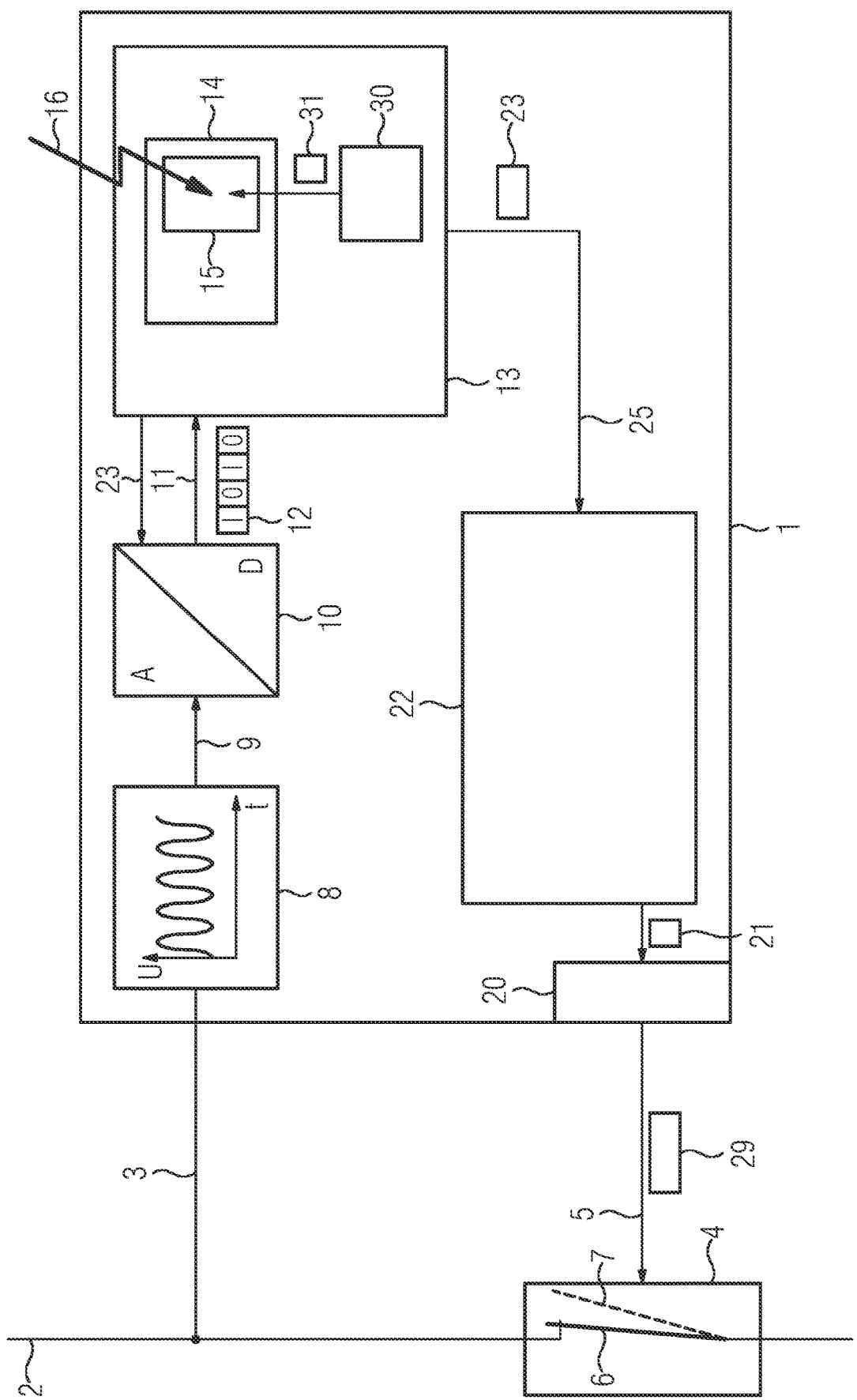

ELECTRICAL EQUIPMENT AND METHOD FOR RECTIFYING DEVICE FAULTS

CROSS-REFERENCE TO RELATED APPLICATION

This application claims the priority, under 35 U.S.C. § 119, of German Patent Application EP 21172364.8, filed May 6, 2021; the prior application is herewith incorporated by reference in its entirety.

FIELD AND BACKGROUND OF THE INVENTION

The invention relates to electrical equipment, more particularly, to an item of electrical equipment with a preprocessing device for digital measured values, the preprocessing device having an integrated circuit and an electronic memory chip that contains a configuration of a logic circuit, and the item of electrical equipment is designed to identify a fault in the preprocessing device. The invention further pertains to a method for rectifying device faults wherein a fault is identified in a preprocessing device for digital measured values that has an integrated circuit and an electronic memory chip containing a configuration of a logic circuit.

A so-called single event upset (SEU) is a "soft" error that may be brought about in semiconductor components when high-energy ionizing radiation (e.g heavy ions, protons, gamma radiation, cosmic radiation) passes through. It is manifested for example as a bit flip (change in the state of a bit) in memory chips or registers, which may lead to a malfunction of the affected unit. The classification as a soft error stems from the fact that an SEU does not cause permanent damage to the affected unit. The effect is described for example on Wikipedia (permanent link: https://de.wikipedia.org/w/index.php?title=Single_Event_Upset&oldid=163234538).

A field programmable gate array (FPGA) or programmable logic gate is a digital-technology integrated circuit into which a logic circuit may be loaded. Such an FPGA is known for example from Wikipedia (permanent link https://de.wikipedia.org/w/index.php?title=Field_Programmable_Gate_Array&oldid=206575960). Complex digital circuit functions may be implemented in an FPGA on a customer-specific basis in a similar manner to a conventional gate array.

The use of FPGAs and the user programmable logic thereof is now widespread in modern multifunctional protective or control devices. So-called static random access memory (SRAM) based FPGAs are frequently used that, although inexpensive, are subject to the SEU effect and thus susceptible to malfunctions.

In contrast to the hard wiring of a gate array, the basis for the flexible wiring properties in the case of the vast majority of FPGAs is a buried SRAM that is completely filled on power-up. This SRAM is called the configuration RAM (CRAM) and uses its content to cater to the configuration and interconnection of the individual basic logic functions of the FPGA, and thus produces the desired internal circuit.

Analog measured values for voltages and currents should be considered especially critical, in particular, since after the digitization of the analog measured variables just a single distorted digital measured value may lead to an incorrect decision in the device. In protection engineering, for example, there might occur an erroneous tripping event of the protective device and thus disconnection of a grid section. The prevention of tripping is likewise conceivable. Considerable financial damage could arise.

A protective device is known for example from the product brochure "SIPROTEC5-Distanzschutz, Leitungsdifferentialschutz and Überstromzeitschutz für 3-polige Auslösung 7SA82, 7SD82, 7SL82, 7SA84, 7SD84, 7SA86, 7SD86, 7SL86, 7SJ86 [SIPROTEC 5-Distance Protection, Line Differential Protection, and Overcurrent Protection for 3-Pole Tripping 7SA82, 7SD82, 7SL82, 7SA84, 7SD84, 7SA86, 7SD86, 7SL86, 7SJ86]", document version: C53000-G5000-0010-D.01, issue: August 2020, V8.30.

Modern FPGAs have supplementary functions that detect soft errors in fractions of a second and are able to report them on to an instance having decision-making capabilities (e.g. a CPU). By way of example, the previously unpublished European patent application with the file reference 21154309.5 discloses the practice of using check values for processed data to quickly and reliably identify SEUs in an item of electrical equipment.

Furthermore, it is known practice to carry out regular automated identification of bit errors for FPGAs. Various types of soft errors may be identified. The scenarios are therefore not limited purely to SEUs, but rather also encompass problems with electromagnetic interference (EMI). EMI may occur in this case as a result of the disruption of other devices by means of electromagnetic effects, for example.

This, for example, involves a checksum being formed for the entire configuration of a logic circuit of the FPGA, i.e., in the simplest case all of the bits are added. The publication "LatticeXP2 Soft Error Detection (SED) Usage Guide", Lattice Semiconductor, 2012, discloses the practice of checking the configuration of an FPGA by means of cyclic redundancy check (CRC). During operation of a protective device with such an FPGA, however, it has been found that this identification takes between a few milliseconds and one second. A malfunction may occur in this period that may lead to erroneous switching actions and associated damage.

To nevertheless identify errors in items of electrical equipment more quickly and prevent erroneous actions, redundant signal processing has also been used to date. By way of example, three devices, or the measured value processing and processor devices thereof, are operated in parallel. An evaluation is considered correct only if at least two devices deliver the same result (decision "2 out of 3"). This design has the disadvantage that it is comparatively complex and expensive and also has an increased space requirement.

Since the occurrence of an SEU has the result that the correct operation of the FPGA is no longer ensured, the latter needs to be "repaired" by reconfiguring its CRAM. This reconfiguration means a brief functional interrupt; all interfaces of the FPGA to the outside stop for a certain period of time. The device then performs a reboot in order to ensure reliable operation again. This process takes approximately half a minute, depending on the device. By way of example, a protective device is not ready during this period, and this constitutes a risk of consequential damage for other equipment of the power transmission grid. This is problematic in particular because experience has shown that large grid operators with many protective devices record such a temporary failure of a protective device owing to an SEU approximately once a month. A further disadvantage is that a reboot for the protective device is visible to customers, who may be obliged to report failures of the protective devices, for example to a central control station. A reboot typically requires an engineer to manually check the protective device, either by remote maintenance or possibly even in situ. This is complex and gives rise to costs.

SUMMARY OF THE INVENTION

On the basis of prior known electrical equipment, the invention is faced with the problem of specifying an equipment item that is comparatively inexpensive to manufacture and avoids errors in the control of a power grid on account of the effect of ionizing radiation on semiconductor chips comparatively reliably.

With the above and other objects in view there is provided, in accordance with the invention, an item of electrical equipment, comprising:
- a preprocessing device for processing digital measured values, said preprocessing device including an integrated circuit and an electronic memory chip that contains a configuration of a logic circuit;
- a configuration memory chip having stored thereon the configuration of the logic circuit; and
- a device configured to identify a fault in said preprocessing device and to interrupt an operation of said preprocessing device on occasion of a fault until the configuration of the logic circuit has been loaded from said configuration memory chip into said electronic memory chip.

An item of electrical equipment may comprise for example a protective device that is arranged in an electrical power transmission or power distribution grid and ensures for example distance protection and/or differential protection and/or overvoltage protection. The protective device may accordingly send protection commands to circuit breakers in the power grid. A power transmission or power distribution grid may be associated with the medium-voltage level (above 1 kV to 52 kV) or with the high-voltage level (above 52 kV).

There may be provision for a measuring device for the equipment item. This measures for example current and/or voltage values as electrical measured variables. E.g. both values may be acquired in the equipment item and transmitted on in analog form, for example to a digital-to-analog converter.

The preprocessing device for digital measured values is e.g. designed to request digital measured values, for example from a digital-to-analog converter. Within the context of this invention, the term digital-to-analog converter also covers an analog-to-digital converter, that is to say a device that converts analog input signals into digital output signals. The sampling rate may be e.g. between 1 kHz and 100 kHz, preferably 5 kHz to 15 kHz, even more preferably 8 kHz. The memory chip containing the configuration is for example susceptible to bit flips owing to an effect of ionizing radiation, and this may lead to erroneous identification of much too high a current or voltage value, for example. Accordingly, a threshold value for the triggering of a protection command for grid disconnection would be incorrectly triggered in the processor device, for example, which can entail substantial costs amounting to millions for the grid operator. The memory chip may be in the form of a CRAM, for example.

Furthermore, there may be provision for a processor device that comprises for example a processor and electronic data memories for temporary storage and/or permanent storage of data. The data telegrams may include protection commands, for example. In a simple case, for example, the evaluation may be a check to determine whether predefined limit values for current and voltage are exceeded. A data telegram may be for example a succession of bits that encode various data. There may be e.g. a protection command included. The data telegrams may be sent e.g. by means of a data communication device. This may involve using a transmission over a powerline, i.e. a so-called powerline communication. Alternatively, a transmission by data cable (e.g. Ethernet over copper line or optical fiber) or by radio (long range radio, 2G, 3G, 4G, 5G) may also take place. A transfer using TCP/IP over the Internet may also take place, for example. The processor device may be designed to enable the evaluation and/or the sending of data telegrams in the event of no fault.

Other items of electrical equipment that may be used are, for example, switches in the power grid.

The invention may advantageously be used not only for faults owing to SEUs but also for the effect of electromagnetic radiation that disrupts the LOCK of an important phase locked loop, for example.

In a preferred embodiment of the item of electrical equipment according to the invention, the integrated circuit comprises a field programmable gate array and the electronic memory chip comprises a static random access memory. This is an advantageous because in particular static random access memory (SRAM) semiconductor chips are sensitive to bit flips owing to e.g. ionizing radiation.

Some FPGAs are capable of automatically performing a so-called auto refresh of their CRAM in order to repair bit flips. The data may come e.g. from an internal or external flash memory. Alternatively, a processor may also reconfigure the FPGA. The processor device, or CPU, initiates this process in the FPGA owing to an SEU report. For the period of the auto refresh, the device firmware disables the protection functions and freezes the hardware driver responsible for the relevant FPGA. After the auto refresh has taken place, the device firmware reinitializes the frozen driver and prompts a status check on the FPGA involved. If said check reveals no problems, the protection is enabled again. In contrast to a device reboot, the whole process requires only fractions of a second. This approach may also be advantageously used for other types of errors such as e.g. a disruptive effect of electromagnetic fields.

In a further preferred embodiment of the invention, a digital-to-analog converter is designed to convert an analog electrical measured variable into a digital measured value at a predefined sampling rate. This is an advantage because it allows analog measured values to be easily converted into digital measured values at a predefined sampling rate.

In a further preferred embodiment of the item of electrical equipment according to the invention, the configuration memory chip comprises a configuration random access memory (CRAM).

In a further preferred embodiment of the item of electrical equipment according to the invention, the equipment item comprises a protective device that is designed to send data telegrams containing protection commands to other equipment items in a power grid by means of a data communication device.

In a further preferred embodiment of the item of electrical equipment according to the invention, the protective device is designed to switch off a hardware driver for the preprocessing device and/or protection functions of the protective device for the duration of the loading of the configuration.

In a further preferred embodiment of the item of electrical equipment according to the invention, the item of electrical equipment is designed to identify a bit flip as a fault.

In a further preferred embodiment of the item of electrical equipment according to the invention, the equipment item is designed to resume operation of the preprocessing device only after a functionality of the loaded configuration has been checked for the preprocessing device.

In a further preferred embodiment of the item of electrical equipment according to the invention, the equipment item is designed to interrupt the operation of the preprocessing device for less than 100 ms. Preferably, the operation is interrupted for less than 60 ms. More preferably still, the operation is interrupted for less than 30 ms. This is an essential advantage of the invention because errors can be rectified more quickly than previously and the protection functions for a power grid are quickly restored.

With the above and other objects in view there is also provided, in accordance with the invention, a method for identifying and rectifying a fault in electrical equipment, the method comprising the steps of:

providing a preprocessing device for digital measured values, the preprocessing device having an integrated circuit and an electronic memory chip that contains a configuration of a logic circuit;

identifying a fault in the preprocessing device; and upon identifying a fault, interrupting an operation of the preprocessing device until the configuration of the logic circuit has been loaded from a configuration memory chip into the electronic memory chip.

In other words, the invention also addresses the problem of specifying a method for rectifying faults in an item of electrical equipment that avoids errors in the control of a power grid on account of the effect of radiation on semiconductor chips.

The same advantages as explained above for the electrical equipment according to the invention at the outset apply equally to the method according to the invention and its embodiments.

An exemplary embodiment of re-initialization of the device function in the event of an FPGA soft error is explained below.

A device configuration of a protective device comprises input/output boards that acquire analog physical variables by way of analog-to-digital converters (typically currents and voltages). Binary information such as for example system status signals is also acquired. The input/output boards output binary information (e.g. system control signals). The whole processing of the measured variables and signals takes place in one FPGA per I/O board, which FPGA in turn interchanges this information in appropriate form with a motherboard.

The motherboard performs cyclic data and status interchange with I/O boards. The operation of the whole device is based on the processing of these data.

By way of example, a sequence of a reinitialization comprises the steps of:

1) Cold or warm boot of the device:
Step 1.1: motherboard: boot
Step 1.2: motherboard: basic initialization of the I/O subsystems (input/output boards; besides many other components, such as e.g. communication); startup of the input/output boards (incl. FPGAs).
Step 1.3: motherboard: launch of the device application
Step 1.4: motherboard: status check/processing of the data of the I/O subsystem (periodically until a serious impairment of operation occurs).

2) An error event in the input/output board FPGA occurs. There is a serious impairment of operation. By way of example, an SEU may have occurred.

3) The memory chip in the FPGA receives a new configuration from the configuration memory chip:
Step 3.1: motherboard: identifies problematic I/O board state on the basis of alarm status, or permanently absent status reports
Step 3.2: motherboard: takes the I/O data processing out of operation and marks it as suspended for all subsequent applications
Step 3.3: motherboard: instructs the relevant I/O board to perform a reconfiguration of its FPGA. By way of example, FPGAs may be used that are even able to perform this reconfiguration automatically in the event of a soft error occurring. Alternatively, in the case of some field devices, an FPGA may reconfigure itself (without instruction), since it may be that the communication is likewise impaired. This self-refresh is delayed e.g. by 0.25 ms in order to ensure that the application is informed before the self-refresh. As a rule, it is delayed for as long as the use case requires.
Step 3.4: motherboard: reinitialization and checking of the I/O subsystem
Step 3.5: motherboard: I/O data processing is continued and is marked as resumed for all subsequent applications.

Other features which are considered as characteristic for the invention are set forth in the appended claims.

Although the invention is illustrated and described herein as embodied in electrical equipment and method for rectifying device faults, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE FIGURES

The sole FIGURE of the drawing shows a schematic representation of an exemplary embodiment of an item of electrical equipment according to the invention.

DETAILED DESCRIPTION OF THE INVENTION

Referring now to the FIGURE of the drawing in detail, there is shown an electrical line 2 of a power transmission grid at the high-voltage level. The high-voltage line 2 is connected (possibly via a non-illustrated measurement transducer) to an item of electrical equipment 1, which is in the form of a protective device 1, by way of a line 3. A measured value processing chain is shown in the protective device 1.

A measuring device 8 for an electrical measured variable is configured to determine the time characteristic t of a voltage U. Analog measured values, in this case an instantaneous voltage value, are output via an analog connection 9. This instantaneous voltage value is converted into a bit string (e.g. "1010") indicating a digital measured value 12 in an analog-to-digital (A/D) converter 10 at a predefined sampling rate of e.g. 8 kHz.

This digital measured value 12 is requested by a preprocessing device 13 for digital measured values 12, for example. The preprocessing device comprises an integrated circuit 14 and an electronic memory chip 15 for configuring a logic circuit. The integrated circuit comprises a field programmable gate array (FPGA) and the electronic memory chip comprises a static random access memory (SRAM).

If high-energy radiation, for example ionizing radiation such as, for instance, gamma radiation 16, impinges on the electronic memory chip 15, a so-called SEU may result. This may lead to a bit flip within the bit string processed in the electronic memory chip 15; that is, the configuration stored in the chip 15 may become damaged. The integrated circuit 14 may no longer operate correctly.

During normal operation, a bit string 23 is made available to a processor device 22 containing a central processing unit (CPU) 26 and a data memory 27 via the data line 25.

The processor device 22 is designed to evaluate the preprocessed measurement data, i.e., the bit string 23. By way of example, it may use a check value such as a checksum to identify a fault, and, in the event of a fault, may suppress the evaluation and/or the sending of data telegrams to other items of electrical equipment 4. The operation of the preprocessing device 13 is interrupted until the configuration 31 of the logic circuit has been loaded from a configuration memory chip 30 into the electronic memory chip 15. This may take place in less than 60 ms, with the result that the device is ready again comparatively quickly.

If there is no fault, the processor device 22 may evaluate the measured values etc. and, if predefined limit values are infringed, perform a protection function for the electrical power grid, for example. In this case, the processor device 22 delivers a protection command 21 to a data communication device 20 that is designed to transfer the protection command 21 as a data telegram 29 to a switch 4 via a data communication connection 5. By way of example, reception of the data telegram 29 in a control device (not shown) for the switch 4 results in the latter being tripped, as a result of which the switch 4 changes from a closed state 6 to an open state 7.

The invention claimed is:

1. An item of electrical equipment, being a protective device that is configured to send data telegrams containing protection commands to other equipment items in a power grid by way of a data communication device, the protective device comprising:
   a preprocessing device for processing digital measured values, said preprocessing device including an integrated circuit and an electronic memory chip that contains a configuration of a logic circuit;
   a configuration memory chip having stored thereon the configuration of the logic circuit; and
   a device configured to identify a fault in said preprocessing device and to interrupt an operation of said preprocessing device on occasion of a fault until the configuration of the logic circuit has been loaded from said configuration memory chip into said electronic memory chip; and
   the protective device being configured to switch off a hardware driver for said preprocessing device and/or protection functions of said protective device for a duration while the configuration is being loaded.

2. The item of electrical equipment according to claim 1, wherein said integrated circuit comprises a field programmable gate array and said electronic memory chip comprises a static random access memory.

3. The item of electrical equipment according to claim 1, wherein said configuration memory chip comprises a configuration random access memory.

4. The item of electrical equipment according to claim 1, configured to identify a bit flip as a fault.

5. An item of electrical equipment, comprising:
   a preprocessing device for processing digital measured values, said preprocessing device including an integrated circuit and an electronic memory chip that contains a configuration of a logic circuit;
   a configuration memory chip having stored thereon the configuration of the logic circuit; and
   a device configured to identify a fault in said preprocessing device and to interrupt an operation of said preprocessing device on occasion of a fault until the configuration of the logic circuit has been loaded from said configuration memory chip into said electronic memory chip; and
   the item of electrical equipment being configured to resume an operation of said preprocessing device only after a functionality of the loaded configuration has been checked for said preprocessing device.

6. The item of electrical equipment according to claim 1, configured to interrupt the operation of said preprocessing device for less than 100 ms.

7. A method for identifying a fault in electrical equipment, wherein the electrical equipment is a protective device configured to send data telegrams containing protection commands to other items of electrical equipment in a power grid by way of a data communication device, the method comprising the steps of:
   providing a preprocessing device for digital measured values, the preprocessing device having an integrated circuit and an electronic memory chip that contains a configuration of a logic circuit;
   identifying a fault in the preprocessing device;
   upon identifying a fault, interrupting an operation of the preprocessing device until the configuration of the logic circuit has been loaded from a configuration memory chip into the electronic memory chip; and
   switching off at least one of a hardware driver for the preprocessing device or protection functions of the protective device by way of the protective device for a duration while the configuration is being loaded.

8. The method according to claim 7, wherein the integrated circuit is a field programmable gate array and the electronic memory chip is a static random access memory.

9. The method according to claim 7, wherein the configuration memory chip is a configuration random access memory.

10. The method according to claim 7, which comprises resuming the operation of the preprocessing device only after a functionality of the loaded configuration has been checked for the preprocessing device.

11. The method according to claim 7, which comprises interrupting the operation of the preprocessing device for less than 100 ms.

* * * * *